United States Patent
Hamamoto et al.

(10) Patent No.: US 6,686,599 B2
(45) Date of Patent: Feb. 3, 2004

(54) ION PRODUCTION DEVICE FOR ION BEAM IRRADIATION APPARATUS

(75) Inventors: Nariaki Hamamoto, Kyoto (JP); Shigeki Sakai, Kyoto (JP)

(73) Assignee: Nissin Electric Co., Ltd., Kyoto (JP)

(*) Notice: Subject to any disclaimer, the term of this patent is extended or adjusted under 35 U.S.C. 154(b) by 0 days.

(21) Appl. No.: 09/996,926

(22) Filed: Nov. 30, 2001

(65) Prior Publication Data

US 2002/0088950 A1 Jul. 11, 2002

(30) Foreign Application Priority Data

Dec. 1, 2000 (JP) .................................... P.2000-366916

(51) Int. Cl.⁷ ............................................... H01J 37/30
(52) U.S. Cl. ............... 250/492.21; 250/250; 250/492.2; 250/251
(58) Field of Search .............................. 250/251, 492.2, 250/492.21

(56) References Cited

U.S. PATENT DOCUMENTS

| | | | |
|---|---|---|---|
| 4,743,767 A | * 5/1988 | Plumb et al. | 250/492.2 |
| 5,399,871 A | 3/1995 | Ito et al. | 250/492.21 |
| 5,576,538 A | 11/1996 | Sakai et al. | 250/251 |
| 5,668,368 A | 9/1997 | Sakai et al. | 250/251 |
| 6,100,536 A | * 8/2000 | Ito et al. | 250/492.21 |
| 6,259,105 B1 | * 7/2001 | Eddy et al. | 250/492.21 |

FOREIGN PATENT DOCUMENTS

| | | |
|---|---|---|
| EP | 0 880 161 | 11/1998 |
| JP | 10027569 | 1/1998 |

OTHER PUBLICATIONS

Search Report—British Patent Office.

* cited by examiner

Primary Examiner—John R. Lee
Assistant Examiner—James J Leybourne
(74) Attorney, Agent, or Firm—Finnegan, Henderson, Farabow, Garrett & Dunner

(57) ABSTRACT

An ion beam irradiation apparatus is provided with a plasma production device 30 which produces a plasma 12 through the radio frequency discharge and supplies the produced plasma in the vicinity of the substrate 4. The plasma production device 30 includes a plasma producing chamber 32 being elongated along an axis 33 extending in scanning directions X in which the ion beam is moved; a plasma emission hole 34 being provided in a side thereof and elongated along the axis 33 of the plasma producing chamber; and a magnet 36 provided outside the plasma producing chamber 32 for producing a magnetic field having a direction along the axis 33. The magnetic field developed by the magnet 36 contains a magnetic field which has a direction along the axis and bends to the substrate ions contained in the plasma 12 emitted from a plasma emission hole 34.

21 Claims, 6 Drawing Sheets

ION PRODUCTION DEVICE FOR ION BEAM IRRADIATION APPARATUS

BACKGROUND OF THE INVENTION

1. Field of the Invention

The present invention relates to an ion production device and an ion beam irradiation apparatus for carrying out a process of implanting ions into a substrate by irradiating the substrate with an ion beam. More particularly, the invention relates to improvement of means for suppressing the accumulatively charging (charge-up) of the substrate when it is irradiated with the ion beam. The charge-up is used hereinafter as the accumulatively charging.

2. Description of the Related Art

There is a proposal of suppressing the charge-up of the substrate when it is irradiated with ion beam. Plasma produced from a plasma production device is supplied in a vicinity of the substrate. Electrons included in the plasma are used of neutralizing the positive charge produced by the ion beam irradiation. The proposed technique supplies to the substrate electrons with lower energy, when comparing with the technique utilizing secondary electrons emitted from an object when it is hit with electrons emitted from the filament. Accordingly, the proposed technique has an advantage of reducing the negative charge in the substrate.

A plasma production device of the radio frequency discharge type is the plasma production device using the radio frequency discharge for plasma generation. This type of the plasma production device is advantageously featured in that a) the lifetime is long because there is no filament, and b) it is operable at low gas pressure. When comparing with the plasma production device of the type which uses the filament for the discharge.

Figure 9:
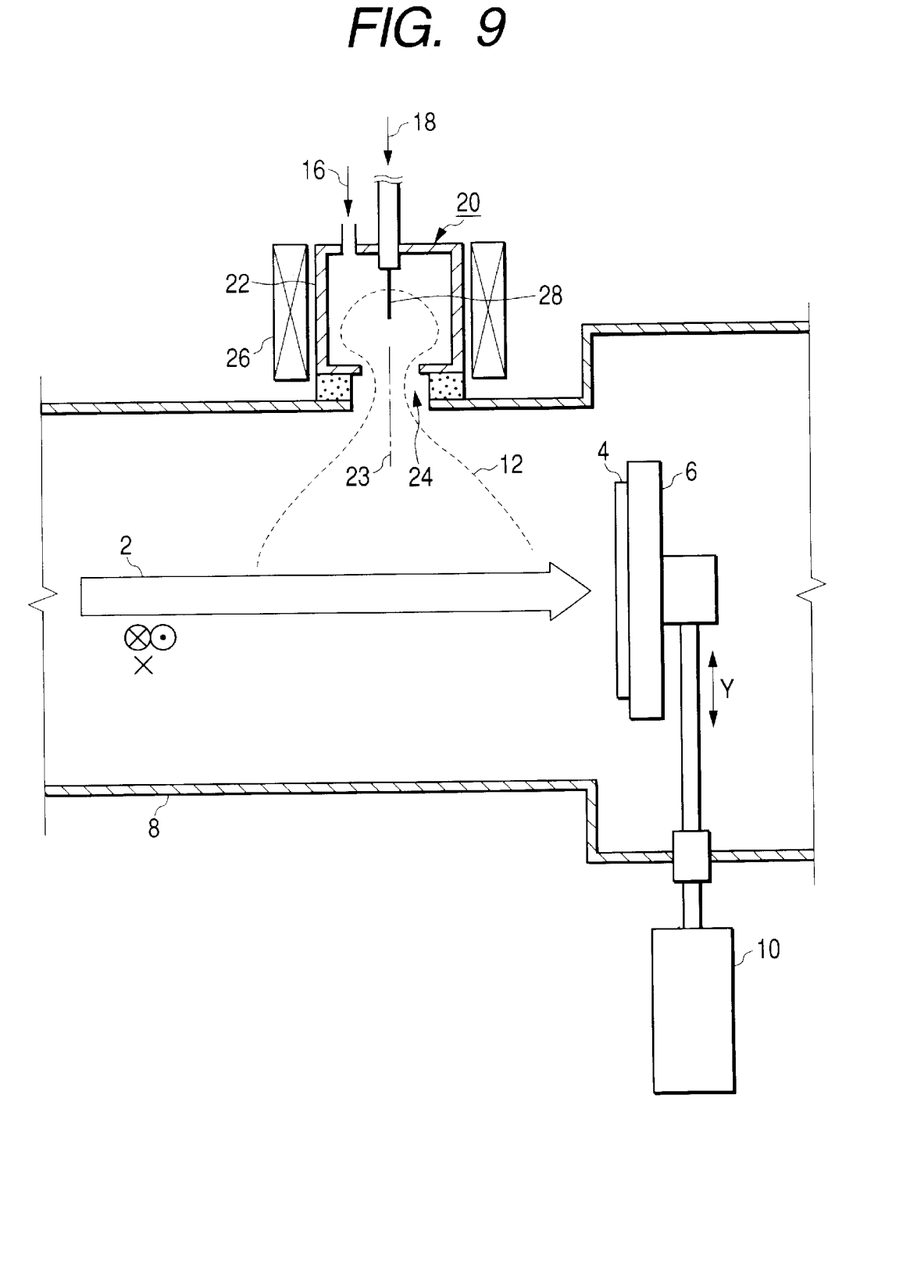
FIG. 9 is a longitudinal sectional view showing an ion beam of the related art irradiation apparatus.

A sectional view showing the related art of a ion beam irradiation apparatus which is provided with a plasma production device of the radio frequency discharge type, is shown in FIG. 9.

An ion beam 2, which is shaped like a spot in cross section, is extracted from an ion source (not shown) in the ion beam irradiation apparatus. And it necessary, the ion beam is mass separated and accelerated before introducing in a vacuum chamber 8. In a vacuum chamber (process chamber) 8, the ion beam is irradiated onto a substrate (e.g., a semiconductor substrate) 4 held by a holder 6 so as to implant ions in the substrate 4 (ion implanting process), while being reciprocatively scanned in fixed directions X by the magnetic field (perpendicular to the surface of the drawing sheet of the figure, e.g., horizontal directions, which will be used hereinafter for the fixed directions).

The substrate 4 and the holder 6 are reciprocatively moved by a holder drive device 10 in a direction Y (e.g., vertical direction, which will he used hereinafter for the direction) The direction Y is substantially perpendicular to the directions X. This reciprocal scanning operation cooperates with the scanning of the ion beam 2 (hybrid-scan) to uniformly irradiate the entire surface of the substrate 4 with the ions.

A plasma production device 20 of the radio frequency discharge type is provided in the vicinity of the substrate 4 as viewed in the beam stream moving direction. The plasma production device 20 produces plasma 12 and supplies it to a region near to and in the vicinity of the substrate 4, whereby suppressing the charge-up of the surface of the substrate 4. The charging up is occurred by the irradiation of the ion beam 2.

The plasma production device 20 is provided with a cylindrical plasma production chamber 22. Gas 16 is introduced into the cylindrical plasma producing chamber 22. An antenna 28 radiates radio frequency wave 18 into the gas-contained chamber, so that the gas is ionized to produce plasma. The produced plasma is emitted outside through a plasma emission hole 24.

A magnetic coil 26, which is provided outside the plasma producing chamber 22, produces a magnetic field into the plasma producing chamber in the direction along an axis 23, which passes through the center of the plasma emission hole 24. The magnetic field is used for producing and maintaining the plasma 12.

When the substrate 4 is irradiated with the ion beam 2, the surface of the substrate 4 is positively charged with the positive charge of the ion beam 2. In particular, when the surface is made of insulating material, it is easy to be charged. When the ion beam is irradiated, the plasma 12 is supplied to a region near the substrate 4 as described above, electrons in the plasma 12 are attracted to the surface of the positively charged substrate, thereby neutralizing the positive charge. If the positive charge is neutralized, the attraction of the electrons into the substrate 4 automatically stops as taught by the theory. In this way, the positively charging up of the substrate surface by the ion beam irradiation is suppressed.

With presence of the plasma production device 20 constructed as mentioned above, the charging up of the substrate surface, which results from the ion beam irradiation, may be suppressed to a certain extent. However, the suppression of the substrate surface charging up is unsatisfactory for the following two reasons.

1) For the scanning, the ion beam 2 is moved in the X direction as described above. The plasma 12 is merely emitted through the small plasma emission hole 24 of the plasma production device 20. Accordingly, an amount of plasma 12 supplied to the ion beam 2 when the ion beam 2 scans a region near the plasma emission hole 24 is greatly different from the plasma amount when the ion beam 2 scans a region located apart from the plasma emission hole 24. This fact implies that it is difficult to uniformly supply the plasma 12 to a region near the ion beam being moved for scan. Accordingly, the suppression of the charge-up is non-uniform. As a result, the charged voltage difference is created on the entire surface of the substrate 4, which receives the ion beam 2 being moved for scan. And the charged voltage is high at some locations on the substrate surface. Actually, the ion beam 2 includes not only ions but also electrons gathered from its environment so that the ion beam 2 is in a plasma state. This is called "beam plasma".

2) The electrons in the plasma 12 produced from the plasma production device 20 have an energy distribution, which is called a Maxwell-Boltzman distribution. The electrons in the plasma 12 produced from the plasma production device have peaks at several eV in the Maxwell-Boltzman distribution of the electrons. Some of those electrons have energy much higher than the peak energy (e.g., 10 to 20 eV or higher). When the substrate 4 receives the electrons having such high energy in a state that the substrate 4 is not irradiated with the ion beam 2, the substrate 4 is negatively charged by the high energy electrons. And the charged voltage on the substrate surface increases to a voltage corresponding to the energy of the high energy electrons.

Generally, in the plasma production device 20 of the radio frequency discharge type, electrons are easy to be accelerated by the radio frequency electric field. Accordingly, high energy electrons are easy to be produced. When an ECR (electron cyclotron resonance) discharge, as is the kind of radio frequency discharge is applied, the electrons are more accelerated by the electron cyclotron resonance. Accordingly, the high energy electrons are easy to be produced, and hence, the negatively charged voltage is easy to increase at the substrate.

Because of the reasons in items 1) and 2), the technique of the related art can insufficiently suppress the charging up of the substrate, surface. Specifically, the capability of suppressing the charged voltage of the substrate surface was approximately ±10–12V at most in the technique of the related art.

Recently, there is an increasing demand of more suppressing the charging up of the substrate surface and more reducing the charged voltage.

In manufacturing the semiconductor device by the ion implanting process based on the ion beam irradiation, it is required to keep the charged voltage of the substrate surface at low voltage (e.g., 6V or lower) during the ion implantation is present in order to avoid the insulation breakdown of the semiconductor device, with the recent trend of miniaturizing the semiconductor device structure. However, the device of the related art is almost incapable of satisfying such a requirement.

SUMMARY OF THE INVENTION

It is an object of the present invention to suppress the charge-up of the surface of the substrate to a small value at the time of ion beam irradiation where a plasma production device of the radio frequency discharge type is used for ion irradiation apparatus.

An ion irradiation apparatus and a plasma production device for an ion beam irradiation apparatus for irradiating to a substrate an ion beam moved to a moving direction, the plasma production device of the present invention comprises:

a plasma production chamber being elongated along an axis extending in the beam moving direction, the plasma production chamber for producing a plasma by the radio frequency discharge, the plasma production chamber having a couple of holes defined along the axis; and a magnet disposed outside the plasma production chamber for producing a magnetic field directed along the axis, wherein the magnetic field bends an ion in the plasma toward the substrate. Since plasma, which is wide and elongated in the ion beam scanning direction, is produced within the plasma production chamber, the wide and long plasma is emitted from the plasma producing chamber through the plasma emission hole by the first magnetic field.

As a result, the plasma is uniformly supplied to a region in the vicinity of the ion beam being moved for scan, so that the charging up occurred on the surface of the substrate is uniformly suppressed by the plasma. The plasma suppresses to produce a large charged voltage, which is locally on the substrate surface. Accordingly, the problem referred to 1) above is successfully solved.

The inventors of the present invention has studied the subject matter and conducted various experiments, and found the following fact. Even if electrons with high energy are included in the plasma produced by the plasma production device, the negative charges in the substrate surface are satisfactorily neutralized by increasing the amount of the ions (referred to as positive ions), which is supplied from the plasma to the substrate. As a result, the charged voltage of the substrate surface can be reduced effectively.

The first magnetic field, which is developed by at least one of the magnets, includes the second magnetic field capable of bending to the substrate ions including in the plasma, which is emitted from the plasma producing chamber. By using the first magnetic field, the ions in the plasma are bent and guided to the substrate, whereby the amount of ions supplied to the substrate may be increased. As a result the negative charges of the substrate surface, caused by the electrons in the plasma emitted from the plasma production device, are satisfactorily neutralized by the ions in the plasma. Moreover, the charge-up of the substrate surface is suppressed, and the charged voltage thereof may be reduced. For this reason, the problem 2) stated above may be solved.

In the present invention, the charge-up of the surface of a substrate is suppressed to a small value at the time of ion beam irradiation by the above-mentioned two operations synergistically, while a plasma production device of the radio frequency discharge type is used. Accordingly, the charged voltage of the substrate surface is reduced to a small value of voltage.

At least one of the magnets is preferably movable in such a directions as to vary its distance to the plasma emission hole. By the movable magnet, an intensity of the second magnetic field to bend the ions to the substrate may be adjusted, and hence, the amount of ions supplied to the substrate may be adjusted. As a result, the balance between the amounts of the positive and negative charges on the substrate surface may be more optimized. Moreover, the charge-up of the substrate surface is suppressed and the charged voltage on the surface may be less.

DESCRIPTION OF THE PREFERRED EMBODIMENTS

Figure 1:
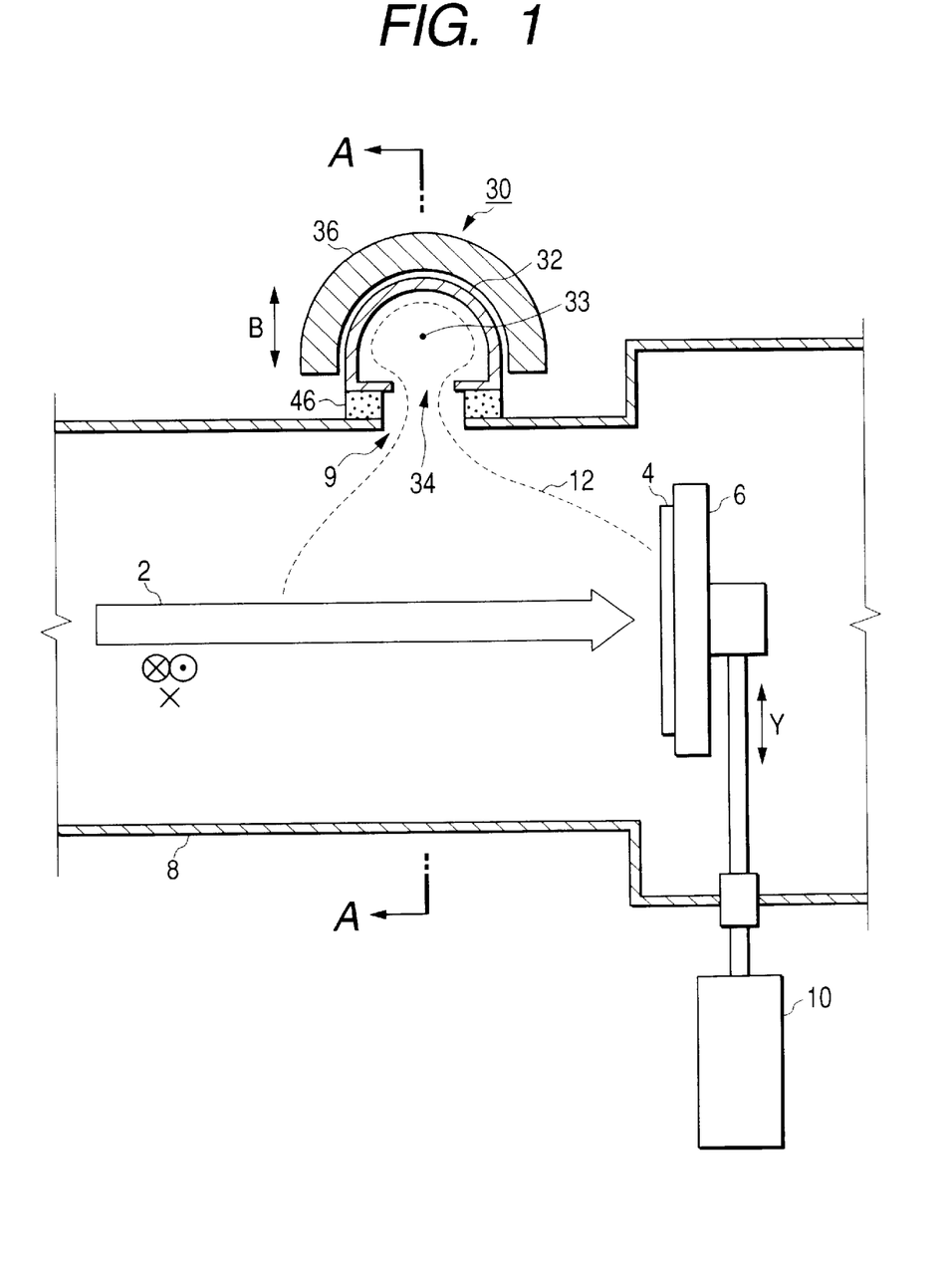
FIG. 1 is a longitudinal sectional view showing an ion beam irradiation apparatus constructed according to the present invention.
Figure 2:
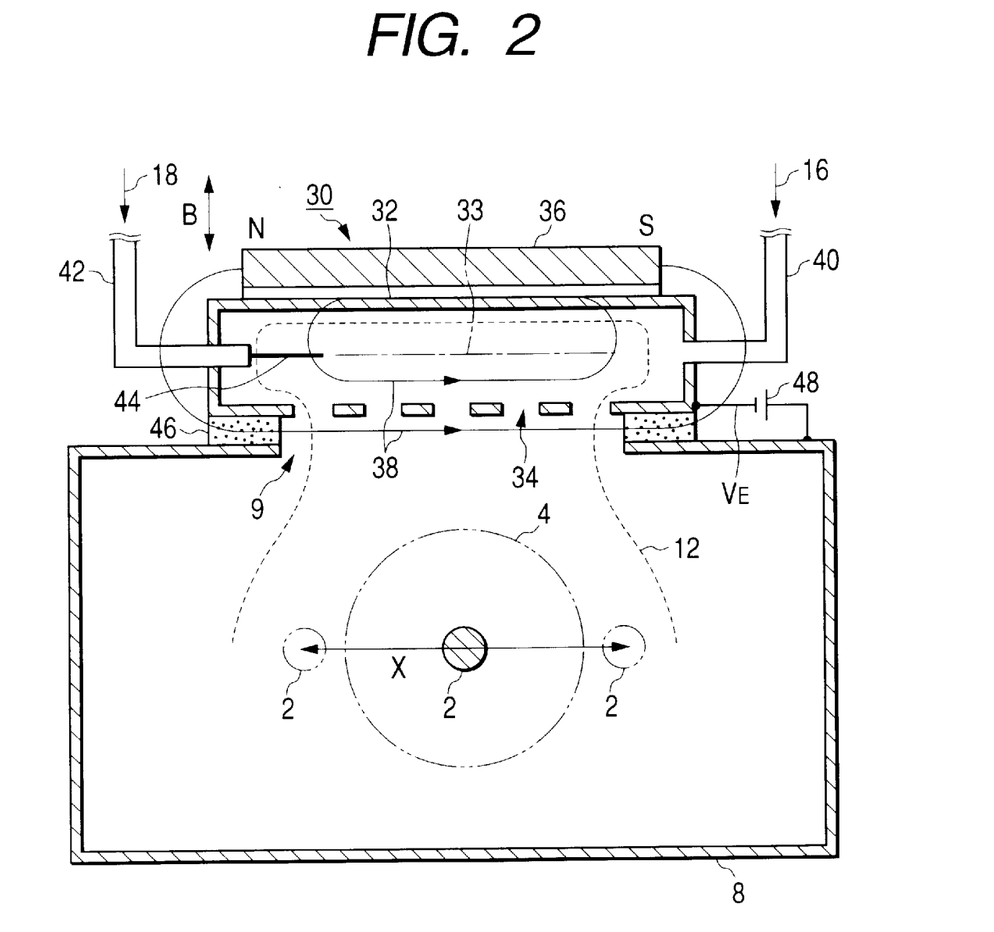
FIG. 2 is cross-sectional view taken on line A—A in FIG. 1.

FIG. 1 is a longitudinal sectional view showing an ion beam irradiation apparatus constructed according to the present invention. FIG. 2 is a cross sectional view taken on line A—A in FIG. 1. In those figures, like reference numerals will be used for designating like or equivalent portions in FIG. 9 showing the technique of the related art. Description to follow will be given placing emphasis on the differences from the technique of the related art.

In the ion beam irradiation apparatus, a plasma production device 30 of the radio frequency discharge type taken in place of a plasma production device 20 of the related art is mounted on the outside of a vacuum chamber 8, which is located in the vicinity of a substrate 4. In the embodiment, an insulating material 46 is interposed between the plasma production device and the vacuum chamber.

The plasma production device 30 includes a plasma producing chamber 32, which is elongated along an axis 33 extending in the scanning direction X of the ion beam 2, and the upper part of the plasma production chamber 32 is semicircular in cross section. The width of the plasma producing chamber 32 is substantially as large as that of the ion beam 2 moving in the scanning direction X. The plasma producing chamber 32 is made of nonmagnetic material so as not to disturb a magnetic field by a magnet 36 to be described later. The same thing is true for other materials located near the magnet 36, such as the vacuum chamber 8 in the FIG. 1, and a tube 50 shown in FIG. 8.

One end face (on the right side in FIG. 2) of the plasma producing chamber 32 is coupled to a gas introducing pipe 40. Gas 16 is introduced into the plasma producing chamber 32. The gas 16 is a xenon gas.

The other end face (on the left side in FIG. 2) of the plasma producing chamber is coupled to a coaxial cable 42. An antenna 44 is connected to the cable, while extending in the axis 33. A radio frequency wave 18 is fed into the plasma producing chamber 32 by way of the coaxial cable 42 and the antenna 44. The radio frequency wave 18 maybe electric energy in the range from about 13.6 MHz to about 2.45 GHz. In the specification, the "radio frequency" has a broad concept involving the microwave".

A plasma emission hole 34 is provided in the lower side (facing the ion beam 2) of the plasma producing chamber 32, while being elongated along the axis 33 of the plasma producing chamber 32.

The plasma emission hole 34 allows the plasma 12 to be emitted into the inner space of the vacuum chamber 8 from the plasma production device 30. The plasma emission hole 34 is disposed along the axis 33 and the width thereof is substantially as large as that of the ion beam 2 moving in the scanning direction X.

The plasma emission hole 34 is a slit elongated in the direction of the axis 33 extending in the scanning direction X of the ion beam 2. It may take the form at least one of long holes (oval holes) or circular holes, which are arranged in parallel in the direction of the axis 33 extending in the scanning direction X of the ion beam 2.

In the instance of FIG. 2, the plasma emission hole is oval in shape. An opening 9, which allows the plasma 12 to pass therethrough, is formed at a part of the vacuum chamber 8 corresponding in position to the plasma emission hole 34.

At least one of magnets 36 is provided on the outside of the plasma producing chamber 32. The magnet 36 produces a first magnetic field having a direction along the axis 33 of the plasma producing chamber 32. The magnet 36 may be a permanent magnet. In the illustrated instance of FIG. 2, one magnet 36 is drawn. If required, a couple of magnets may be used as will be described later (see FIGS. 6 and 7). The magnet 36 is shaped to be semicircular in cross section, and is disposed along the plasma producing chamber 32. As shown, the magnet 36 is disposed along the plasma producing chamber 32 (i.e., the axis 33) while covering the whole upper part of the plasma producing chamber 32. The magnet 36 is disposed along the plasma producing chamber 32 in the region, which is substantially as large as that of the ion beam 2 moving the scanning direction X. The magnet 36 has the polarities of N and S at both ends as viewed in the directions along the axis 33. The first magnetic field, which is developed by the magnet 36, is defined by magnetic field lines 38 as illustrated.

Figure 6:
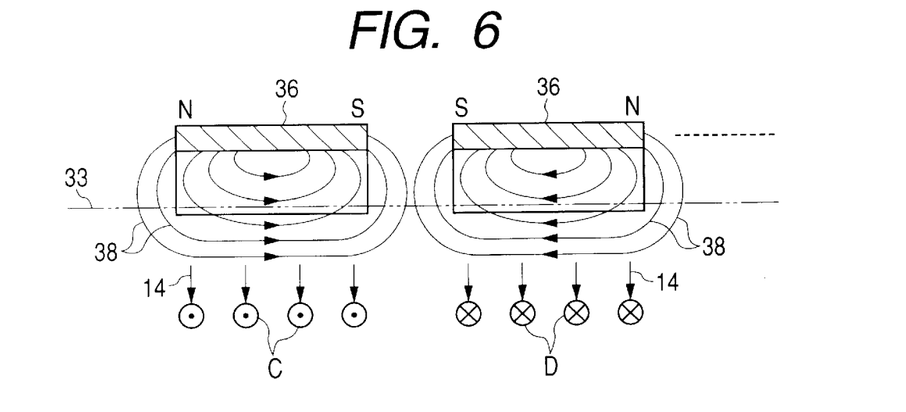
FIG. 6 is a view showing, in model form, magnets provided in the plasma production device and magnetic fields configured respectively by the magnets, the substrate being located on the obverse surface of the drawing sheet.
Figure 7:
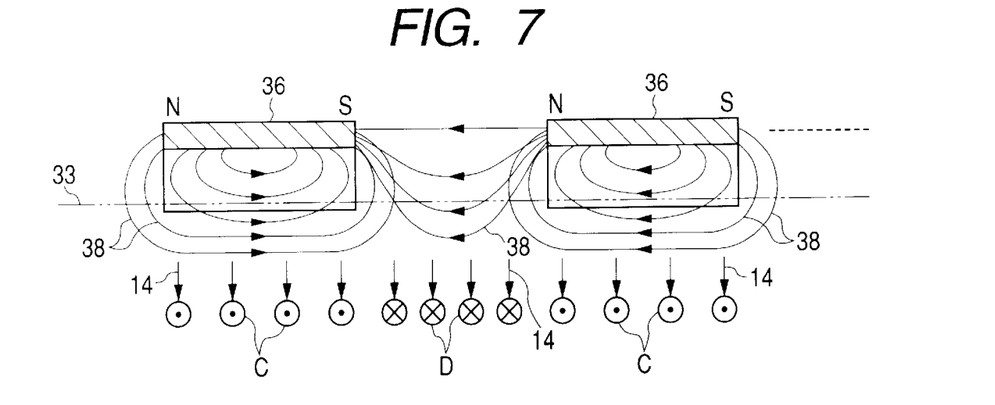
FIG. 7 is a view showing, in model form, magnets provided in the plasma production device and magnetic fields configured respectively by the magnets, the substrate being located on the obverse surface of the drawing sheet.

The first magnetic field developed by at least one of the magnets 36 is distributed having the directions along the axis 33. The second magnetic field, which is included in the first magnetic field, leads ions 14 included in the plasma 12 toward the substrate 4. The plasma 12 is ejected front the plasma emission hole 34. Examples of means for producing such a magnetic field are illustrated in FIGS. 5 to 7.

A first magnetic field producing by one magnet 36 shown in FIG. 5 will be described. A distribution of the first magnetic field developed by the magnet 36 is shown in FIG. 5. In this case, the substrate 4 is located on the obverse side (this side) of a drawing sheet. That is, the drawing of this figure is viewed from the side containing the substrate 4 (the same thing is true for FIGS. 6 and 7).

Figure 5:
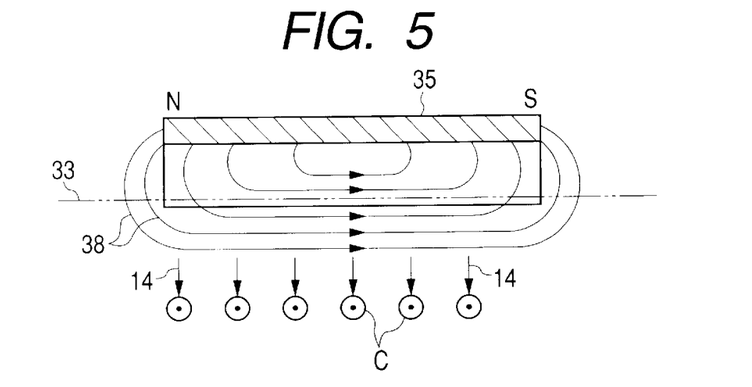
FIG. 5 is a view showing, in model form, a magnet provided in the plasma production device and a magnetic field configured by the magnet, the substrate being located on the obverse surface of the drawing sheet.

In the magnetic field by the FIG. 5 means, lines of magnetic force have one direction. In the plasma production device using this means, ions 14 included in the plasma 12 discharged through the plasma emission hole 34 are placed in a magnetic field having a right direction along the axis 33, and bent to the substrate 4 by a force of a direction denoted as C and guided to the substrate 4.

An operation of the plasma production device 30 will be described by using FIGS. 1 and 2 again. The gas 16 and the radio frequency wave 18 are introduced into the plasma producing chamber 32. Then, high frequency discharging occurs within the plasma producing chamber 32, the gas 16 is ionized, and the plasma 12 is produced. A magnetic field, which is developed by the magnet 36, contributes to the generation and maintaining of the plasma 12. In other words, because of presence of the magnetic field, high density plasma 12 is produced and maintained.

The plasma 12 produced within the plasma producing chamber 32 is ejected to the ion beam 2 within the vacuum chamber 8 through the plasma emission hole 34, and supplied to a region located in the vicinity of the substrate 4. As already stated, actually, the ion beam 2 includes not only ions but also electrons gathered from its environment, and hence it forms beam plasma. In an upstream region of the substrate 4, the plasma 12 is also supplied to this beam plasma.

When the substrate 4 is irradiated with the ion beam 2, the plasma 12 is supplied to a region near the ion beam 2 forming the beam plasma and the substrate 4. Then, electrons of the plasma 12 are pulled into the substrate surface, which has positively been charged with the beam irradiation, so that the positive charges in the substrate surface are neutralized. Electrons in the plasma 12 are also pulled into the ion beam 2 as the beam plasma. When the substrate 4 has been charged, the electrons migrate to the substrate 4 through the beam plasma, under the potential of the substrate. And the electrons neutralize the positive charges in the substrate 4. When the positive charges in the substrate surface are neutralized, the pulling of the electrons to the substrate 4 automatically stops. In this way, the charge-up of the substrate surface by the ion beam irradiation is suppressed. The above is a basic operation for suppressing the charge-up of the substrate.

The plasma production device 30 is provided with the plasma producing chamber 32 and the plasma emission hole 34, which are extended along the axis 33, which extends in the scanning directions X of the ion beam 2. Further, it includes the magnet 36 for developing a magnetic field having the direction along the axis 33. Accordingly, the plasma 12 produced is wide and elongated in the ion beam scanning directions X within the plasma producing chamber 32, and such wide and long plasma 12 may be emitted through the plasma emission hole 34. As a result, even if the ion beam 2 is moved in the scanning directions X as shown in FIG. 2, the plasma 12 may be uniformly supplied to a region near the ion beam 2. Therefore, the charge-up in the surface of the substrate 4 is uniformly suppressed. In other words, there is less chance of locally forming the large charged voltage.

The inventors of the present invention has studied the subject matter and conducted various experiments, and found the following fact. Even it electrons of high energy are included in the plasma 12 produced by the plasma production device 30, if the amount of ions supplied from the plasma 12 to the substrate 4 is appropriately increased, the negative charges in the substrate surface are satisfactorily neutralized by the ions. As a result, the charged voltage of the substrate surface can be reduced effectively.

In this case, the magnetic field generated by the magnet 36 bends the ions 14, which are included in the plasma 12 ejected from the plasma emission hole 34, toward the substrate 4, as stated referring to FIG. 5. By using such a magnetic field, the amount of ions 14 supplied to the substrate 4 is increased.

To clarity this, orbital difference between the electrons 13 and the ions 14 ejected from the plasma emission hole 34 under the magnetic field by the magnet 36 will be described with reference to FIGS. 3 and 4.

Figure 3:
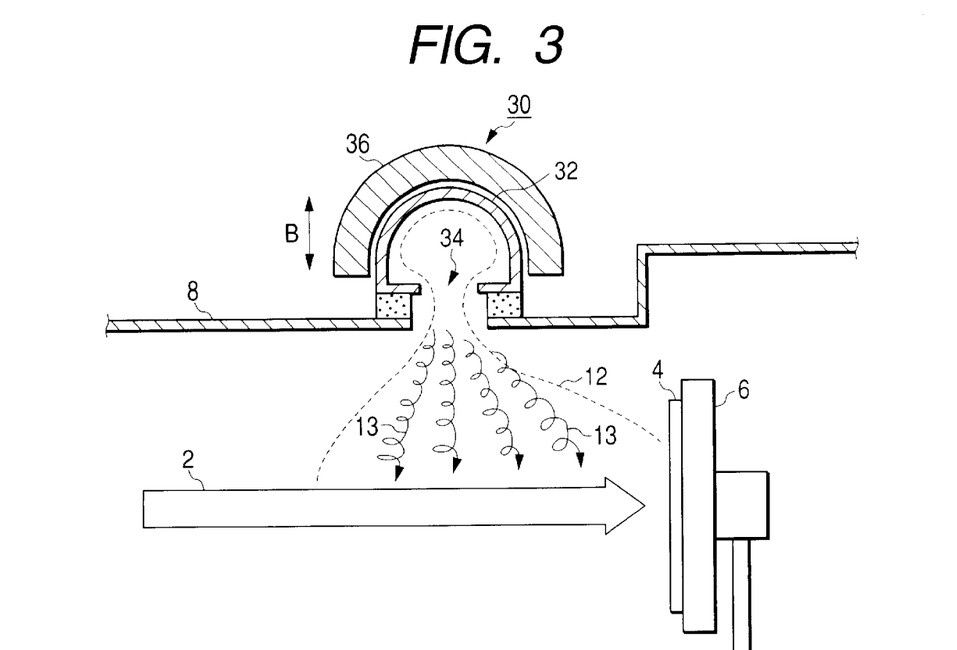
FIG. 3 is a view showing orbital movements of electrons of a plasma produced by and ejected from the plasma production device in model form.

FIG. 3 shows orbital movements of the electrons 13. Energy of the electrons 13 emitted from the plasma emission hole 34 is distributed within a zone ranging from several eV to several tens eV. When it is considered in the value of maintaining the radio frequency discharge within the plasma producing chamber 32, an intensity of the magnetic field produced by the magnet 36 lies in the order of $10^{-2}$ to $10^{-1}$ tesla in the vicinity of the axis 33 of the plasma producing chamber 32. In the vicinity of the exit of the plasma emission hole 34, the intensity is weaker than the $10^{-2}$ to $10^{-1}$ tesla. Accordingly, the cyclotron radius of the electron 13 in the magnetic field is approximately several mm in the vicinity of the exit of the plasma emission hole 34. Accordingly, the electron 13 moves to the ion beam 2 while spirally turning with such a small, cyclotron radius. Actually, the magnetic field becomes smaller as the distance from the plasma emission hole 34 increases, and hence the cyclotron radius gradually increases. Those electrons 13 spirally turn with the small radius independently. Accordingly, the directivity of the electrons 13 to the substrate 4 is small when comparing with the ions 14 to be given later.

Figure 4:
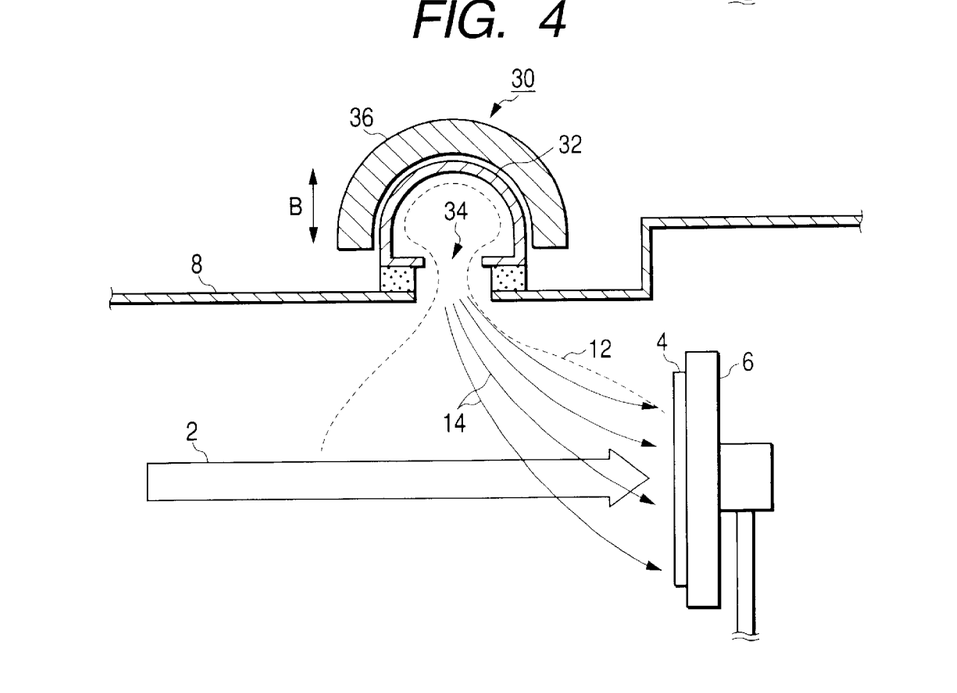
FIG. 4 a view showing orbital movements of ions of the plasma produced by and ejected from the plasma production device, in mode form.

Orbital movements of the ions 14 of the plasma 12, which are emitted from the plasma emission hole 34 are illustrated in FIG. 4. A mass of the ion 14 is much larger than that of the electron 13. Accordingly, the cyclotron radius of the ion 14 is considerably large even if the vicinity of the exit of the plasma emission hole 34 is placed under a magnetic field by the magnet 36, which is like that for the electrons. Accordingly, the ions 14 are bent as a whole to the substrate 4, and hence are directed to the substrate 4 with a good directivity. As a result, the ions 14 of the plasma 12 are bent to the substrate 4 and guided thereto, so that the amount of ions 14 supplied from the plasma 12 to the substrate 4 is increased. The magnetic field becomes weak as the distance from the plasma emission hole 34 increases. Accordingly, the cyclotron radius of the ion 14 gradually increases. This tendency is convenient for the guiding of the ions 14 to a broad area on the substrate 4.

In this way, the amount of ions supplied to the substrate 4 is increased. As a result, the negatively charge of the substrate by the electrons of the plasma 12 emitted from the plasma production device 30 may be neutralized satisfactorily by the ions of the plasma 12. As a result, the charge-up of the substrate surface is suppressed to be a low charged voltage of the surface.

As seen from the foregoing description, the ion beam irradiation apparatus succeeds in suppressing the charged voltage of the surface of a substrate to a small value at the time of ion beam irradiation where a plasma production device 30 of the radio frequency discharge type is used. This produces the following advantageous results. No insulation breakdown occurs in the semiconductor device when it is irradiated with the ion beam, and hence a production yield is improved in the manufacturing of semiconductor devices. Further, it also copes with the miniaturization of the semiconductor device.

Usually, the ion beam 2 is moved for scan to positions beyond the ends of the substrate 4 as in the FIG. 2 case (overscannig). The substrate 4 is also moved in the direction Y as stated above. To be more exactly, a time period (first period) that the substrate 4 is hit with the ion beam 2 and another time period (second period) that it is not hit with the ion beam 2 are present during the generation of a plasma 12 by the plasma production device 30. The behaviors of charge up of the surface of the substrate and of suppressing the surface charge-up in the first period are different from those in the second period.

During the first period that the substrate 4 is hit with the ion beam 2, the surf ace of the sutbstrate is positively charged by the positive charges of the ion beam 2 and the secondary electrons that are emitted from the substrate 4 as the result of the ion beam irradiation. However, the positive charges are neutralized since electrons in the plasma 12 emitted from the plasma production device 30 are pulled into the beam plasma and move to the substrate 4. Where a sufficient amount of electrons acting to neutralize the positive charges on the substrate exist, the neutralizing operation progresses till the charged voltage on the substrate surface is decreased to 0. When it is reduced to 0, the supplying of electrons automatically stops.

During the second period that the substrate 4 is not hit with the ion beam 2, the substrate 4 is exposed to the plasma 12 produced and emitted from the plasma production device 30. A charged voltage on the surface of the substrate is determined by the balance between the amount of electrons and the amount of ions in the plasma 12, and the energy of the electrons. Generally, the mass of the electron is lighter than that of the ion, and its mobility of the electrons is large. Then, the voltage charged at this time is negative in polarity. When little amount of ions are present in the vicinity of the substrate 4, the charged voltage increases to a voltage corresponding to the maximum energy of the electrons in the plasma 12. As described above, in the plasma production device 30 (or 20) of the radio frequency discharge type, electrons with a high energy are likely to be produced. Accordingly, the negative charged voltage tends to increase.

The ion beam irradiation apparatus under discussion is capable of bending, by the magnetic field produced by the magnet 36, the ions 14 in the plasma 12 that is emitted from the plasma production device 30 to the substrate 4, and guiding them to the same. Even when the ion beam irradiation apparatus is used under the condition that the substrate 4 is not hit with the ion beam 2, the negatively charging of the substrate surface is well suppressed with the ions 14, so that the negatively charged voltage may be a small value.

In the magnetic field producing means, at least one of the magnets 36 is preferably movable in such a directions B as to vary its distance to the plasma emission hole 34 (in which the magnet moves to and apart form the plasma emission hole 34). In the case of the FIG. 1 means, one magnet 36 is used. Accordingly, the magnet 36 is movable in the directions B or vertical directions.

By so doing, an intensity of the magnetic field to bend the ions 14 in the plasma 12, which is emitted from the plasma production device 30, to the substrate 4 may be adjusted. In other words, the cyclotron radius of the ion 14 show in FIG. 4 may be increased or decreased. Accordingly, the amount of the ions 14 supplied to the substrate 4 may be adjusted. As a result, the balance between the amounts of the positive and negative charges on the substrate surface may be more optimized, and hence the charge-up of the substrate surface is suppressed and the charged voltage on the surface maybe more reduced.

Another magnetic field producing means including the magnets 36 will be described with reference to FIG. 6. As shown, a couple of magnets 36 are arranged side by side along the axis 33 such that the opposed magnetic poles between the adjacent magnets has the same polarity. An appropriate number of magnets may be used for those magnets thus linearly arranged (The same thing is true for the case of FIG. 7.). In the thus arranged magnetic field producing means, a couple of magnetic field distributions are developed by those magnets 36, and the magnetic fields defined by some of them each bend, in the direction denoted as C, the ions 14 in the plasma 12 that is emitted through the plasma emission hole 34 of the plasma production device 30, and the magnetic fields defined by the remaining magnetic field distributions each bend the ions 14 in the direction (denoted as D) opposite to the direction C. Under the magnetic fields defined by the latter magnetic field distributions, the ions 14 are bent to the reverse side of the drawing sheet (ire., in the direction denoted as D). In other words, the ions in the plasma 12 may be guided to the substrate 4 with a certain directivity. Accordingly, the ions and the electrons in the plasma 12 are both guided to the substrate 4. The amounts of the ions and electrons thus guided may be adjusted by adjusting the magnetic field distributions, for example, adjusting the positions and the number of magnets 36, and intensities of the magnetic fields developed by the magnets. In this respect, a freedom of adjustment is large. As a result, it is easy to optimize the substrate surface charging.

An additional magnetic field producing means is shown in FIG. 7. In this means, as shown, a couple of magnets 36 are arranged side by side along the axis 33 such that the opposed magnetic poles of the adjacent magnets are opposite to each other in polarity, in this means, a composite magnetic field is formed between the adjacent magnets 36. The composite magnetic field is opposite in direction to the magnetic fields produced by those magnets per se. Also in this magnetic field producing means, the magnetic fields defined by the magnetic field distributions developed by the magnets 36 each bend, in the direction denoted as C, the ions 14 in the plasma 12 that is emitted from the plasma emission hole 34 of the plasma production device 30, the composite magnetic fields each bend the ions 14 in the direction opposite to the direction C. Accordingly, the magnetic field producing means operates as in the FIG. 6 case.

A positive or negative voltage VE output from an extracting DC power source 48 maybe applied to the plasma producing chamber 32, as shown in FIG. 2. By so doing, the amounts of ions and electrons in the plasma 12, which is emitted from the plasma production device 30, may be controlled in accordance with the magnitude and polarity of the voltage VE. When the voltage VE is negative, a negative voltage is set up in the plasma producing chamber 32. Under this condition, the electrons are easy to be emitted through the plasma emission hole 34 (but the ions are hard to be emitted). As a result, the amount of electrons in the plasma 12 increases. In this case, if the voltage VE goes more negative, the amount of electrons is further increased. Conversely, if the voltage VE goes positive, a positive potential is set up in the plasma producing chamber 32. In this case, the ions are easy to be emitted through the plasma emission hole 34 (but the electrons are hard to be emitted). As a result, the amount of ions in the plasma 12 increases. If the voltage VE goes more positive, the amount of ions in the plasma 12 is more increased. Thus, the means mentioned above may control the charging state on the substrate surface.

The inner wall of the plasma producing chamber 32 may be covered with an insulating material in order to prevent the inner wall thereof from contaminated with metallic material by the sputtering of the plasma 12, to prevent conductive sputtered material from sticking to the antenna 44, and to prevent other disadvantages.

The plasma producing chamber 32 is not limited in configuration to the semicircular tube mentioned above, but may be a tube square in cross section, a cylindrical tube, or the like.

The configuration of the magnet 36 is also not limited to the tube semicircular in cross section, but may be a tube shaped like U in cross section.

The position of the antenna 44 for high frequency introduction is not limited to the end face of the plasma producing chamber 32, but may be near the center of the plasma producing chamber 32 as longitudinally viewed. A plurality of antennae 44 may be used instead. Further, the antenna 44 may be substituted by high frequency electrodes, wave guide for microwave, or the like.

The ECR condition may be set up within the plasma producing chamber 32 by the utilization of a magnetic field produced by the magnet 36. In a case where the frequency of the radio frequency wave 18 is 2.45 GHz, the ECR condition holds within the plasma producing chamber 32 if a magnetic field of $875 \times 10^{-4}$ tesla is produced in the plasma producing chamber. Accordingly, the ECR discharge may be caused. With this, the efficiency of producing the plasma 12 may be increased.

Figure 8:
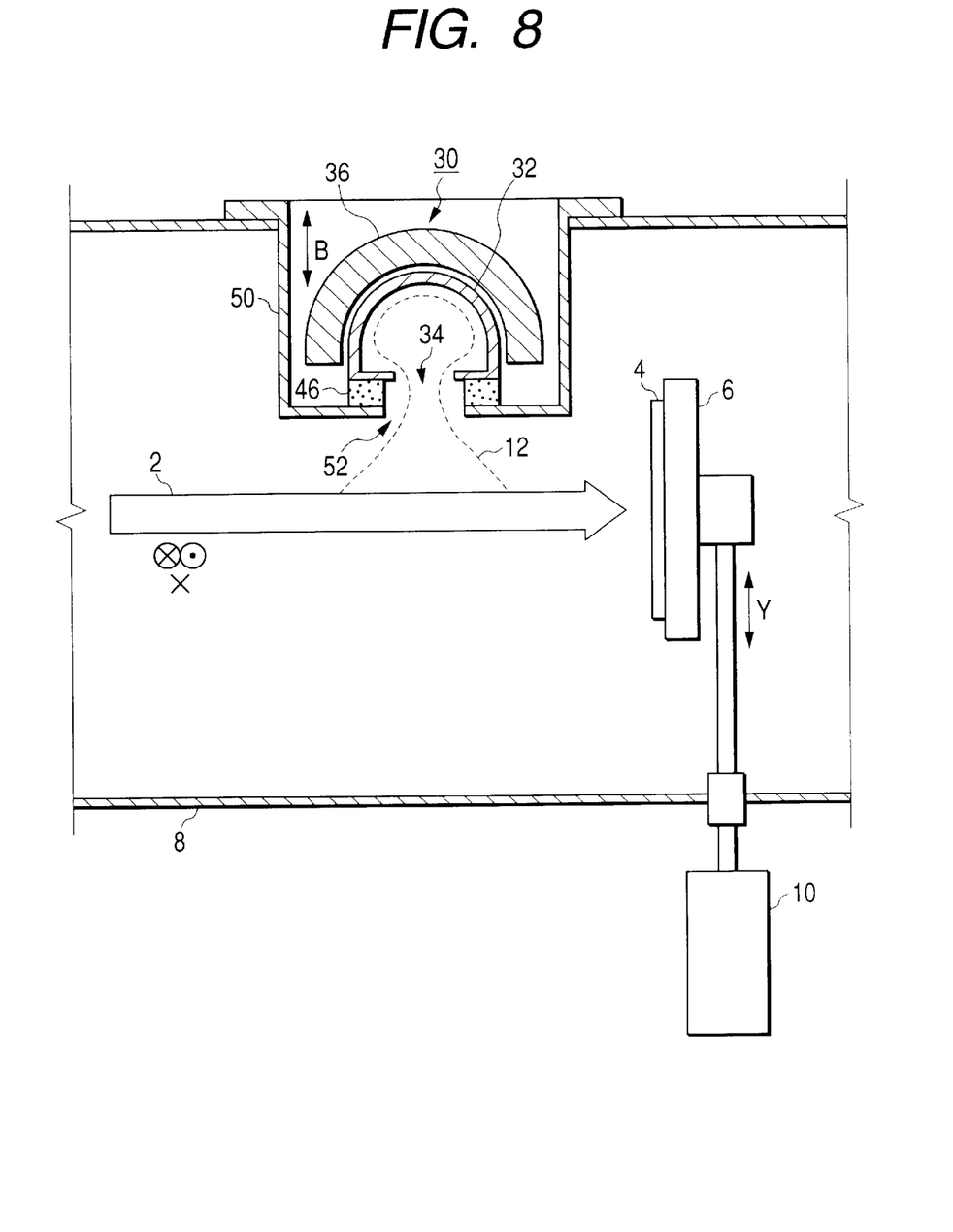
FIG. 8 is a longitudinal sectional view showing another ion beam irradiation apparatus constructed according to the present invention.

The plasma production device 30 may be provided within the vacuum chamber 8 in order to locate it close to the ion beam 2. In an alternative, as shown in FIG. 8, the plasma production device 30 may be provided in a tube 50 inserted in the vacuum chamber 8. The tube 50 has an opening 52 for discharging a plasma 12. In the alternative, thus, the plasma production device 30 is located close to the ion beam 2. The plasma 12 is effectively supplied to the ion beam 2 and the beam plasma containing it, from a position closer to the latter. The plasma 12 may effectively be utilized through the charging restriction.

The plasma production device 30 may be provided closer to and in the vicinity of the substrate 4, and be attached to a Faraday cup (not shown), which is used for measuring a beam current of the ion beam 2.

The present invention thus constructed has the following useful effects.

In the ion beam irradiation apparatus of the invention, within the plasma producing chamber, a plasma is produced which is wide and elongated in the ion beam scanning direction, and the long and wide plasma is emitted from the plasma producing chamber. Accordingly, the plasma is uniformly supplied to a region in the vicinity of the ion beam being moved for scan. As a result, the charging up of the surface of the substrate is uniformly suppressed, thereby preventing large charged voltage from appearing locally on the substrate surface. This results in suppressing the formation of locations having large charged voltage.

The magnetic field developed by at least one magnet bends to the substrate ions contained in the plasma emitted from the plasma producing chamber. By using such a magnetic field, the ions in the plasma are bent and guided to the substrate, whereby the amount of ions supplied to the substrate may be increased. The negative charges of the substrate surface, caused by the electrons in the plasma emitted from the plasma production device, are satisfactorily neutralized by the ions in the plasma. As a result, the charge-up of the substrate surface is suppressed, and the charged voltage of the same may be reduced. For this reason, the problem 2) stated above can be solved.

In the invention, the above two operations synergistically act, and the charging-up of the surface of a substrate is suppressed to a small value at the time of ion beam irradiation where a plasma production device of the radio frequency discharge type is used. Accordingly, the charged voltage of the substrate surface is reduced to a small value of voltage.

In another ion beam irradiation apparatus of the invention, at least one of the magnets is movable. Therefore, an intensity of the magnetic field to bend the ions to the substrate may be adjusted, and hence, the amount of ions supplied to the substrate may be adjusted. As a result, the balance between the amounts of the positive and negative charges on the substrate surface may be more optimized, and hence the charging up of the substrate surface is suppressed and the charged voltage on the surface may be more reduced.

What is claimed is:

1. A plasma production device for an ion beam irradiation apparatus which irradiates to a substrate an ion beam, the plasma production device comprising:
    a plasma production chamber being elongated along an axis extending in a scanning direction, the plasma production chamber for producing a plasma by the radio frequency discharge, the plasma production chamber having a plasma emission hole defined along the axis; and
    a first magnet disposed outside the plasma production chamber for producing a first magnet field directed along the axis,
    wherein the magnet field bends charged particles in the plasma toward substrate and suppresses a charge-up of the substrate.

2. The plasma production device according to claim 1, further comprising:
    a second magnet disposed out side the plasma production chamber for producing a second magnetic field directed along the axis,
    wherein the second magnetic field bends an electron in the plasma toward the substrate.

3. The plasma production device according to claim 2, wherein the first magnet is alternated with the second magnet along the axis.

4. The plasma production device according to claim 1, wherein a plurality of the first magnet are arranged along the axis with a predetermined distance for producing the magnetic field therebetween, the magnetic field has an opposed direction of the first magnetic to bend the electron in the plasma toward the substrate.

5. The plasma production device according to claim 1, wherein the first magnet is movable in a direction to which a distance from the first magnet to the plasma emission hole is varied.

6. The plasma production device according to claim 5, wherein the first magnet is a permanent magnet.

7. The plasma production device according to claim 1, wherein the plasma production chamber is formed by non-magnetic material.

8. The plasma production device according to claim 1, further comprising:
    an gas introducing pipe connected to the plasma production chamber for introducing a gas.

9. The plasma production device according to claim 1, wherein the plasma production chamber includes an antenna for producing the radio frequency discharge in the plasma production chamber.

10. The plasma production device according to claim 1, wherein an inside wall of the plasma production chamber is covered with a insulating material to avoid adhering contaminates thereto.

11. The plasma production device according to claim 1, further comprising:
    a direct current power source for supplying a voltage to the plasma production chamber for controlling an amount of ions and electrons in the plasma.

12. The plasma production device according to claim 1, wherein the plasma production chamber has the plasma emission hole elongated along the axis.

13. The plasma production device according to claim 12, wherein the plasma production chamber has the plasma emission hole defined along the axis is a circle.

14. The plasma production device according to claim 1, wherein the plasma production chamber is substantially formed in a semi-cylinder shape.

15. The plasma production device according to claim 2, wherein the second magnet is movable in a direction to which a distance from the magnet to the plasma emission hole is varied.

16. The plasma production device according to claim 15, wherein the second magnet is a permanent magnet.

17. An ion irradiating apparatus for irradiating to substrate an ion beam, the ion irradiating apparatus comprising:
    a plasma production device for producing a plasma by a radio frequency discharge, the plasma production device having
        a plasma production chamber being elongated along an axis extending in a scanning direction, the plasma production chamber for producing a plasma by the radio frequency discharge, the plasma production chamber having a plasma emission hole defined along the axis, and
        a first magnet disposed outside the plasma production chamber for producing a magnetic field directed along the axis, so that the magnetic field bends charged particles in the plasma toward the substrate and suppresses a charge-up of the substrate, the first magnet is a permanent magnet movable in a direction to which a distance from the first magnet to the plasma emission hole is varied;

a vacuum chamber for irradiating to a substrate ion beam derived from an ion source, the vacuum chamber having, a holder for holding the substrate, and a holder driving device for driving the holder; and an insulating material interposed between the plasma production device and the vacuum chamber.

18. The ion irradiating apparatus according to the claim 17, further comprising:

a second magnet disposed outside the plasma production chamber for producing a second magnetic field directed along the axis, so that the second magnetic field bends an electron in the plasma toward the substrate, the second magnet is a permanent magnet movable in a direction to which a distance from the second magnet to the plasma emission hole is varied.

19. The ion irradiating apparatus according to claim 17, wherein a plurality of the first magnet are arranged along the axis with a predetermined distance for producing the magnetic field therebetween, the magnetic field has an opposed direction of the first magnetic to bend the electron in the plasma toward the substrate.

20. The plasma production device according to claim 18, wherein the first magnet is alternated with the second magnet along the axis.

21. The plasma production device according to claim 3, wherein the first magnet and second magnet are substantially formed in a semi-cylinder shape.

* * * * *

UNITED STATES PATENT AND TRADEMARK OFFICE
CERTIFICATE OF CORRECTION

PATENT NO. : 6,686,599 B2
DATED : February 3, 2004
INVENTOR(S) : Hamamoto et al.

It is certified that error appears in the above-identified patent and that said Letters Patent is hereby corrected as shown below:

Column 11,
Lines 58 and 60, "magnet field" should read -- magnetic field --.
Line 61, "toward substrate" should read -- toward the substrate --.
Line 65, "out side" should read -- outside --.

Column 12,
Line 10, "first magnetic" should read -- first magnet --.
Line 23, "an gas" should read -- a gas --.
Line 31, "a insulating" should read -- an insulating --.

Column 13,
Line 12, "to the claim" should read -- to claim --.

Column 14,
Line 8, "first magnetic" should read -- first magnet --.

Signed and Sealed this

Twenty-ninth Day of June, 2004

JON W. DUDAS
*Acting Director of the United States Patent and Trademark Office*